United States Patent
He et al.

(10) Patent No.: US 11,675,402 B2
(45) Date of Patent: Jun. 13, 2023

(54) MAINTAINING A THRESHOLD OPERATING TEMPERATURE IN AN INFORMATION HANDLING SYSTEM

(71) Applicant: Dell Products L.P., Round Rock, TX (US)

(72) Inventors: Qinghong He, Austin, TX (US); Adolfo S. Montero, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 14 days.

(21) Appl. No.: 17/452,508

(22) Filed: Oct. 27, 2021

(65) Prior Publication Data

US 2023/0127216 A1    Apr. 27, 2023

(51) Int. Cl.
*G06F 1/20* (2006.01)
*G06F 11/30* (2006.01)
*H05K 7/20* (2006.01)

(52) U.S. Cl.
CPC .......... *G06F 1/206* (2013.01); *G06F 11/3062* (2013.01); *H05K 7/20209* (2013.01)

(58) Field of Classification Search
CPC ...................................................... G06F 1/206
See application file for complete search history.

(56) References Cited

U.S. PATENT DOCUMENTS

| | | | |
|---|---|---|---|
| 8,868,947 B2 * | 10/2014 | Park | G06F 1/32 713/320 |
| 10,222,843 B1 * | 3/2019 | Lin | H05K 7/20209 |
| 2004/0257013 A1 * | 12/2004 | Chhleda | G06F 1/206 318/268 |
| 2006/0095796 A1 * | 5/2006 | Chotoku | G06F 1/206 713/300 |
| 2013/0073096 A1 * | 3/2013 | Brey | G05B 13/02 700/282 |
| 2014/0117908 A1 * | 5/2014 | Busch | H02P 1/04 318/471 |
| 2016/0282916 A1 * | 9/2016 | Shabbir | G06F 1/206 |
| 2018/0059747 A1 * | 3/2018 | Pfeifer | G06F 1/206 |
| 2021/0068302 A1 * | 3/2021 | North | G06F 9/5055 |
| 2021/0263574 A1 * | 8/2021 | Berke | G11C 5/04 |

* cited by examiner

*Primary Examiner* — Suresh Suryawanshi
(74) *Attorney, Agent, or Firm* — McDermott Will & Emery LLP

(57) ABSTRACT

In one embodiment, a method for maintaining a threshold operating temperature in an information handling system includes: identifying an operating temperature associated with the information handling system; determining a first fan speed associated with one or more fans of the information handling system based on the operating temperature; causing the one or more fans to rotate based on the first fan speed; identifying that the operating temperature has increased to reach the threshold operating temperature; and in response to identifying that the operating temperature has increased to reach the threshold operating temperature: identifying a power consumption level associated with the information handling system; determining a second fan speed associated with the one or more fans based on the power consumption level; and causing the one or more fans to rotate based on the second fan speed.

17 Claims, 5 Drawing Sheets

350

360 | 320

| | |
|---|---|
| POWER CONSUMPTION LEVEL 370-1 | FAN SPEED 380-1 |
| POWER CONSUMPTION LEVEL 370-2 | FAN SPEED 380-2 |
| POWER CONSUMPTION LEVEL 370-3 | FAN SPEED 380-3 |
| POWER CONSUMPTION LEVEL 370-4 | FAN SPEED 380-4 |
| POWER CONSUMPTION LEVEL 370-5 | FAN SPEED 380-5 |
| POWER CONSUMPTION LEVEL 370-6 | FAN SPEED 380-6 |
| POWER CONSUMPTION LEVEL 370-7 | FAN SPEED 380-7 |
| ⋮ | ⋮ |
| POWER CONSUMPTION LEVEL 370-N | FAN SPEED 380-N |

FIG. 3B

MAINTAINING A THRESHOLD OPERATING TEMPERATURE IN AN INFORMATION HANDLING SYSTEM

BACKGROUND

Field of the Disclosure

The disclosure relates generally to information handling systems, and in particular to maintaining a threshold operating temperature in an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed method for maintaining a threshold operating temperature in an information handling system includes: identifying, by an embedded controller (EC) of the information handling system, an operating temperature associated with the information handling system; determining, by the EC, a first fan speed associated with one or more fans of the information handling system based on the operating temperature; causing, by the EC, the one or more fans to rotate based on the first fan speed; identifying, by the EC, that the operating temperature has increased to reach the threshold operating temperature; and in response to identifying that the operating temperature has increased to reach the threshold operating temperature: identifying, by the EC, a power consumption level associated with the information handling system; determining, by the EC, a second fan speed associated with the one or more fans based on the power consumption level; and causing, by the EC, the one or more fans to rotate based on the second fan speed.

In one or more of the disclosed embodiments, determining the first fan speed associated with the one or more fans based on the operating temperature includes: accessing, by the EC, a memory of the EC, the memory including a first look up table storing a plurality of operating temperatures associated with the information handling system, the plurality of operating temperatures corresponding to a first plurality of fan speeds associated with the one or more fans; identifying, by the EC, the operating temperature from the plurality of operating temperatures; and selecting, by the EC, the first fan speed from the first plurality of fan speeds based on the operating temperature.

In one or more of the disclosed embodiments, determining the second fan speed associated with the one or more fans based on the power consumption level includes: accessing, by the EC, the memory of the EC, the memory including a second look up table storing a plurality of power consumption levels associated with the information handling system, the plurality of power consumption levels corresponding to a second plurality of fan speeds associated with the one or more fans; identifying, by the EC, the power consumption level from the plurality of power consumption levels; and selecting, by the EC, the second fan speed from the second plurality of fan speeds based on the power consumption level.

In one or more of the disclosed embodiments, identifying that the operating temperature has increased to reach the threshold operating temperature comprises: monitoring, by the EC, the operating temperature during an operation of the information handling system; comparing, by the EC, the operating temperature to the threshold operating temperature; and determining, by the EC, that the operating temperature is equal to the threshold operating temperature.

In one or more of the disclosed embodiments, identifying the operating temperature associated with the information handling system includes: receiving, by the EC, operating temperature data from one or more sensors of the information handling system.

In one or more of the disclosed embodiments, identifying the power consumption level associated with the information handling system includes: receiving, by the EC, power consumption level data from a charger integrated circuit (IC) of the information handling system.

In one or more of the disclosed embodiments, the second fan speed corresponds to a best fit curve indicating a relationship between the power consumption level and the second fan speed, the best fit curve configured to maintain the threshold operating temperature during an operation of the information handling system.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIGS. 3A and 3B illustrate selected elements of an embodiment of respective look up tables stored in a memory.

DESCRIPTION OF PARTICULAR EMBODIMENT(S)

Figure 1:
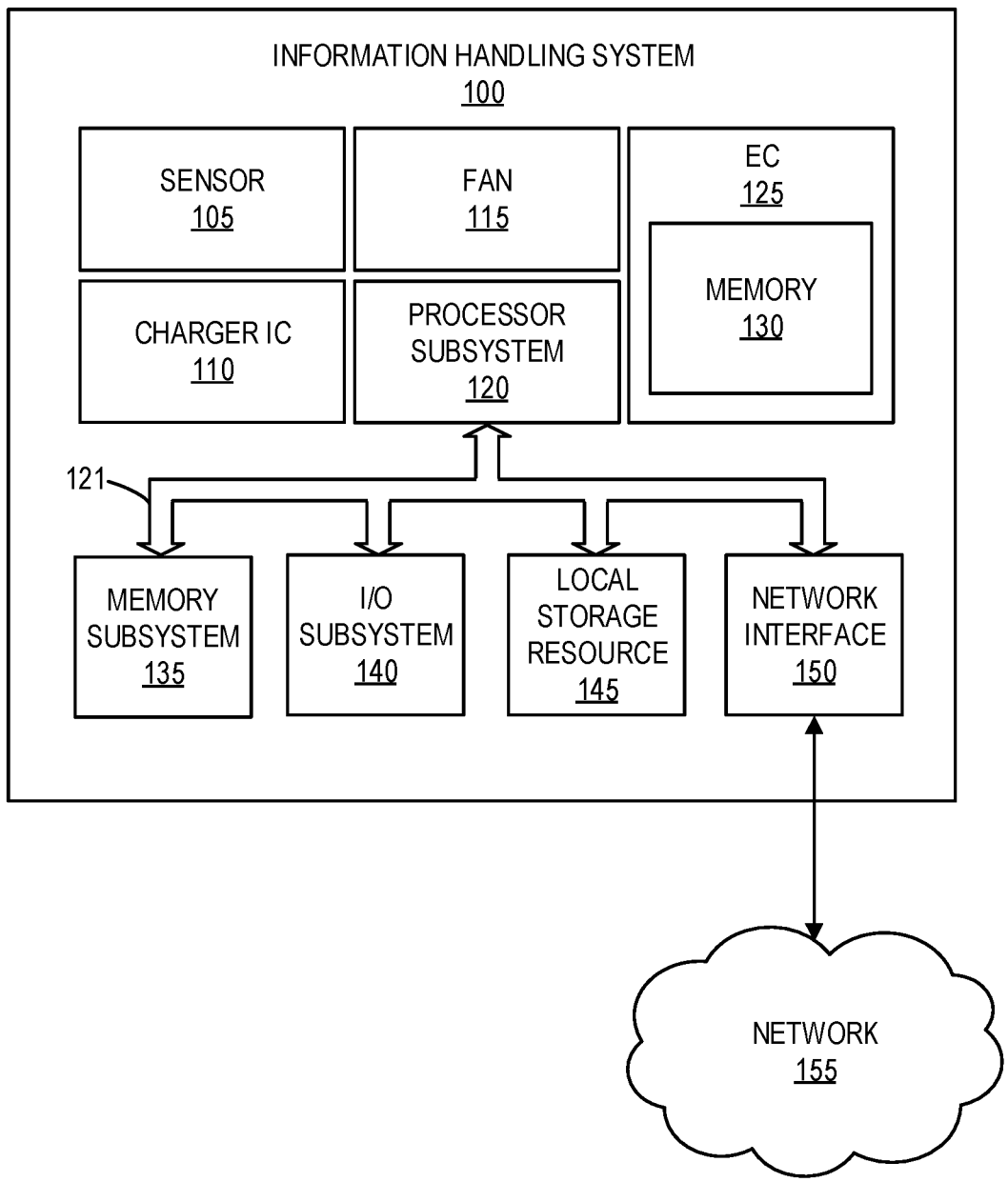
FIG. 1 is a block diagram of selected elements of an embodiment of a computing environment that includes an information handling system.

This document describes a method for maintaining a threshold operating temperature in an information handling system that includes: identifying, by an embedded controller (EC) of the information handling system, an operating temperature associated with the information handling system; determining, by the EC, a first fan speed associated with one or more fans of the information handling system based on the operating temperature; causing, by the EC, the one or more fans to rotate based on the first fan speed; identifying, by the EC, that the operating temperature has increased to reach the threshold operating temperature; and in response to identifying that the operating temperature has increased to reach the threshold operating temperature: identifying, by the EC, a power consumption level associated with the information handling system; determining, by the EC, a second fan speed associated with the one or more fans based on the power consumption level; and causing, by the EC, the one or more fans to rotate based on the second fan speed.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Turning now to the drawings, FIG. 1 is a block diagram of selected elements of an embodiment of a computing environment that includes an information handling system. Specifically, FIG. 1 illustrates a block diagram depicting selected elements of an information handling system 100 in accordance with some embodiments of the present disclosure. In other embodiments, information handling system 100 may represent different types of portable information handling systems, such as, display devices, head mounted displays, head mount display systems, smart phones, tablet computers, notebook computers, media players, foldable display systems, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems.

In the embodiment illustrated in FIG. 1, components of information handling system 100 may include, but are not limited to, a processor subsystem 120, which may comprise one or more processors, and system bus 121 that communicatively couples various system components to processor subsystem 120 including, for example, a memory subsystem 135, an I/O subsystem 140, a local storage resource 145, and a network interface 150. System bus 121 may represent a variety of suitable types of bus structures (e.g., a memory bus, a peripheral bus, or a local bus) using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express (PCIe) bus, HyperTransport (HT) bus, and Video Electronics Standards Association (VESA) local bus. As shown in FIG. 1, information handling system 100 may additionally include one or more sensors 105, a charger integrated circuit (IC) 110, one or more fans 115, and an embedded controller (EC) 125 that includes a memory 130. In other embodiments, computing environment 160 may include additional, fewer, and/or different components than the components shown in FIG. 1.

In information handling system 100, processor subsystem 120 may comprise a system, device, or apparatus operable to interpret and/or execute program instructions and/or process data, and may include a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 135 and/or another component of information handling system 100). In the same or alternative embodiments, processor subsystem 120 may interpret and/or execute program instructions and/or process data stored remotely. In one embodiment, processor subsystem 120 may be or include a multi-core processor comprised of one or more processing cores disposed upon an IC chip. In other embodiments, processor subsystem 120 may be or include an integrated device (e.g., microcontroller, system on a chip (SoC), and the like) that includes dedicated memory, peripheral interfaces, and/or other components suitable for interpreting and/or executing program instructions and/or processing data.

In one embodiment, memory subsystem 135 may comprise a system, device, or apparatus operable to retain and/or retrieve program instructions and/or data for a period of time (e.g., computer-readable media). Memory subsystem 135 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In one embodiment, I/O subsystem 140 may comprise a system, device, or apparatus generally operable to receive and/or transmit data to, from, and/or within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, a camera, or another type of peripheral device.

In one embodiment, local storage resource 145 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In one embodiment, network interface 150 may be a suitable system, apparatus, or device operable to serve as an interface between information handling system 100 and a network 155. Network interface 150 may enable information handling system 100 to communicate over network 155 using a suitable transmission protocol and/or standard, including, but not limited to, transmission protocols and/or standards enumerated below with respect to the discussion of network 155. Network 155 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), a Cloud network, an Edge network, an intranet, the Internet or another appropriate architecture or system that facilitates the communication of signals, data and/or messages (generally referred to as data). Network interface 150 may enable wired and/or wireless communications (e.g., NFC or Bluetooth) to and/or from information handling system 100.

In particular embodiments, network 155 may include one or more routers for routing data between client information handling systems 100 and server information handling systems 100. A device (e.g., a client information handling system 100 or a server information handling system 100) on network 155 may be addressed by a corresponding network address including, for example, an Internet protocol (IP) address, an Internet name, a Windows Internet name service (WINS) name, a domain name or other system name. In particular embodiments, network 155 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

In one embodiment, network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof.

In one embodiment, each sensor 105 (collectively referred to herein as "sensors 105") may comprise a system, device, or apparatus operable to sense, or otherwise detect, an operating temperature associated with information handling system 100. Specifically, each sensor 105 may be or include a thermal sensing device operable to detect an operating temperature associated with information handling system 100 during operation. In one embodiment, one or more sensors 105 may be disposed on a motherboard (not shown in figure) of information handling system 100 such that the one or more sensors 105 may sense, or otherwise detect, an operating temperature associated with information handling system 100. For example, one or more sensors 105 may sense, or otherwise detect, a surface temperature, or "skin temperature," associated with one or more covers (i.e., C cover, D cover, and the like) comprising a housing of information handling system 100. In this example, the operating temperature of information handling system 100 may be sensed, or otherwise detected, directly and/or indirectly by the one or more sensors 105 based on the skin temperature.

In one embodiment, respective sensors 105 may be communicably coupled to one or more devices disposed throughout information handling system 100 such that an operating temperature may be extrapolated based on operating temperatures collectively sensed, or otherwise detected, by each of the respective sensors 105. For example, respective sensors 105 may be communicably coupled to processor subsystem 120, one or more graphics processing units (GPU) of information handling system 100 (not shown in figure), and memory subsystem 135 such that the operating temperatures collectively sensed, or otherwise detected, by each of the respective sensors 105 may be used (i.e., by EC 125) to extrapolate an operating temperature associated with information handling system 100. In one embodiment, each operating temperature associated with information handling system 100 may correspond to a number of rotations per minute (RPMs), or a "fan speed," associated with one or more fans 115 of information handling system 100. That is, each operating temperature may correspond to a fan speed required to maintain an optimal operating temperature, and/or acoustic performance, of information handling system 100. In one embodiment, each sensor 105 may be or include a resistance temperature detector (RTD). In other embodiments, each sensor 105 may be or include a negative temperature coefficient (NTC) thermistor, a thermocouple sensor, a semiconductor-based sensor, and/or any other type of sensor suitable for sensing, or otherwise detecting, an operating temperature associated with information handling system 100. Sensors 105 are described in further detail with respect to FIGS. 2-3B.

In one embodiment, charger IC 110 may comprise a system, device, or apparatus operable to manage an overall power consumption, or a "power consumption level," associated with information handling system 100. In particular, charger IC 110 may be or include a hardware device (i.e., IC) disposed on a motherboard (not shown in figure) of information handling system 100 operable to detect, manage, and/or report a power consumption level associated with information handling system 100 during operation. In one embodiment, power consumption levels may be classified, or otherwise categorized, (e.g., by charger IC 110, EC 125, and the like) in terms of respective workloads associated with information handling system 100. For example, charger IC 110 may detect, manage, and/or report a power consumption level associated with a significant, or "heavy," workload that consumes approximately 15 Watts (W) of power while information handling system 100 executes a computer-aided design (CAD) application. Similarly, in another example, charger IC 110 may detect, manage, and/or report a power consumption level associated with a typical, or "light," workload that consumes approximately 10 W of power while information handling system 100 executes a word processing application. In the examples above, a light workload may comprise approximately 66% of a heavy workload. In one embodiment, each power consumption level associated with information handling system 100 may correspond to a fan speed associated with one or more fans 115 of information handling system 100. That is, each power consumption level may correspond to a fan speed required to maintain an optimal operating temperature, and/or acoustic performance, of information handling system 100. Charger IC 110 is described in further detail with respect to FIGS. 2-3B.

In one embodiment, each fan 115 (collectively referred to herein as "fans 115") may comprise a system, device, or apparatus operable to cause airflow within information handling system 100. In particular, each fan 115 may be or include a hardware device operable to direct a surrounding airflow across one or more devices (e.g., processor subsystem 120, EC 125, and the like) to cause ambient heat (i.e., operating temperature) within a housing of information handling system 100 to exit the housing (e.g., via one or more vents of information handling system 100). As described above, each operating temperature associated with information handling system 100 may correspond to a fan speed associated with one or more fans 115 of information handling system 100. That is, each operating temperature may correspond to a fan speed required to maintain an optimal operating temperature, and/or acoustic performance, of information handling system 100. Similarly, each power consumption level associated with information handling system 100 may correspond to a fan speed associated with one or more fans 115 of information handling system 100. That is, each power consumption level may correspond to a fan speed required to maintain an optimal operating temperature, and/or acoustic performance, of information handling system 100. In one embodiment, each fan 115 may be or include a centrifugal fan that includes a ducted housing to direct outgoing air across one or more devices of information handling system 100. In other embodiments, fan 115 may be or include a positive displacement blower, a helical screw blower, a high-speed blower, a regenerative blower, and/or any other type of blower suitable for directing a surrounding air flow across one or more devices of information handling system 100. Fan 115 is described in further detail with respect to FIGS. 2-3B.

In one embodiment, EC 125 may comprise a system, device, or apparatus operable to support various system tasks on behalf of information handling system 100. In particular, EC 125 may be or include an electronic hardware device (e.g. a microcontroller) operable to perform hardware initialization during a pre-boot sequence of information handling system 100 and to identify any failures or issues that may occur during initialization. In one embodiment, EC 125 may execute firmware instructions (e.g., stored in memory 130) that allows EC 125 to generate a diagnostic testing sequence used to detect, examine, and/or initialize one or more devices within, or communicably coupled to, information handling system 100. In one embodiment, EC 125 may maintain, or otherwise manage, an operating temperature associated with information handling system 100. Specifically, EC 125 (i.e., firmware instructions stored in memory 130) may identify that information handling system 100 has reached a maximum operating temperature, or a "threshold operating temperature," and may cause one or more fans 115 to rotate based on fan speeds associated with the threshold operating temperature.

Conventionally, on-board fan assemblies (e.g., fan 115) may generate loud acoustics, such as a fan noise, while in use that may be distracting to a user. Further, the noise generated by on-board fan assemblies may be worsened during instances in which a user may require an increased performance from one or more devices of information handling system 100 that may cause an operating temperature associated with information handling system 100 to increase. For example, a user may increase a clock rate of a GPU of information handling system 100 to cause the GPU to run at a higher speed than that which it was manufactured to run, thereby "overclocking" the GPU to increase performance. In response, on-board fan assemblies may be required to operate at a higher fan speeds to compensate for an increased operating temperature of information handling system 100 (i.e., caused by the overclocked GPU), which may increase overall acoustics generated by information handling system 100. In an effort to reduce such acoustics, conventional firmware instructions may allow operating temperatures to increase up to, and/or in excess of, a threshold operating temperature before causing fan speeds to increase. However, such delay may cause a rapid increase in fan speed in response to reaching, and/or exceeding, the threshold operating temperature, thereby further worsening the noise generated by on-board fan assemblies and decreasing overall user experience.

In contrast, EC 125 may refrain from causing a rapid increase in fan speed in response to reaching, and/or exceeding, the threshold operating temperature. In particular, rather than rapidly increasing fan speed based on operating temperature, EC 125 may cause one or more fans 115 of information handling system 100 to rotate in accordance with a power consumption level associated with information handling system 100. As such, noise generated by one or more fans 115 may be significantly reduced (e.g., 56.3% reduction) as fan speed increases and/or decreases gradually in accordance with increases and/or decreases in power consumption level rather than operating temperatures, thereby increasing acoustic performance of information handling system 100 and overall user experience.

To refrain from causing the rapid increase in fan speed described above, EC 125 may first identify an operating temperature associated with information handling system 100. In one embodiment, EC 125 may receive operating temperature data from one or more sensors 105 of information handling system 100 to identify the operating temperature. In the embodiment illustrated in FIG. 1, EC 125 may be communicably coupled to one or more sensors 105 such that EC 125 may receive the operating temperature data in real-time as it is captured by the one or more sensors 105. In another embodiment, EC 125 may query, or otherwise poll, one or more sensors 105 to receive the operating temperature data periodically. For example, EC 125 may send a sensor 105 one or more interrupts requesting the operating temperature data.

As described above, each operating temperature associated with information handling system 100 may correspond to a fan speed associated with one or more fans 115 of information handling system 100. That is, each operating temperature may correspond to a fan speed required to maintain an optimal operating temperature, and/or acoustic performance, of information handling system 100. Thus, EC 125 may determine a fan speed associated with one or more fans 115 of information handling system 100 based on the identified operating temperature. Once determined, EC 125 may cause the one or more fans 115 to rotate based on the determined fan speed. For example, EC 125 may cause one or more fans 115 disposed throughout information handling system 100 to rotate according to a fan speed of less than 3,500 RPM based on an operating temperature of less than 47° C.

In one embodiment, EC 125 may identify that a threshold operating temperature has been reached by information handling system 100. In particular, EC 125 may identify that the threshold operating temperature has been reached, and/or exceeded, (i.e., operating temperature greater than or equal to the threshold operating temperature) based on the operating temperature data received from one or more sensors 105. In one embodiment, EC 125 may monitor the operating temperature during an operation of information handling system 100 and may compare the operating temperature to the threshold operating temperature (e.g., stored in memory 130). If EC 125 determines that the operating temperature is greater than, or equal to, the threshold operating temperature, EC 125 may identify that the threshold operating temperature has been reached, and/or exceeded.

In one embodiment, EC 125 may identify a power consumption level associated with information handling system 100 in response to identifying that the threshold operating temperature has been reached. In one embodiment, EC 125 may receive power consumption level data from charger IC 110 of information handling system 100 to identify a power consumption level. In the embodiment illustrated in FIG. 1, EC 125 may be communicably coupled to charger IC 110 such that EC 125 may receive the power consumption level data in real-time as it is detected, managed, and/or reported by charger IC 110. In another embodiment, EC 125 may query, or otherwise poll, charger IC 110 to receive the power consumption level data from charger IC 110 periodically. For example, EC 125 may send charger IC 110 one or more interrupts requesting the power consumption level data. In yet another embodiment, EC 125 may identify a power consumption level associated with information handling system 100 based on respective power consumption levels of one or more components of information handling system 100. For example, EC 125 may identify a first power consumption level associated with a GPU of information handling system 100 and a second power consumption level associated with a CPU (e.g., processor subsystem 120) of information handling system 100. In this example, EC 125 may identify a power consumption level associated with information handling system 100 based on the first power consumption level and the second power consumption level. For instance, EC 125 may add the first power consumption level to the second power consumption level. In another example, EC 125 may identify a power consumption level associated with information handling system 100 based on either the first power consumption level or the second power consumption level individually. For instance, EC 125 may identify the power consumption level associated with information handling system 100 based on the higher power consumption level between the first power consumption level and the second power consumption level.

As described above, each power consumption level associated with information handling system 100 may correspond to a fan speed associated with one or more fans 115 of information handling system 100. That is, each power consumption level may correspond to a fan speed required to maintain an optimal operating temperature, and/or acoustic performance, of information handling system 100. Thus, EC 125 may determine a fan speed associated with one or more fans 115 of information handling system 100 based on the identified power consumption level. Once determined, EC 125 may cause one or more fans 115 to rotate based on the determined fan speed. For example, EC 125 may cause one or fans 115 disposed throughout information handling system 100 to rotate according to a fan speed greater than 3,500 RPM based on a power consumption level greater than 10 W. By causing the one or more fans 115 to rotate according to a fan speed based on a power consumption level of information handling system 100 rather than rapidly increasing fan speed based on operating temperature, EC 125 may cause a significant reduction (e.g., 56.3% reduction) in noise as fan speed increases and/or decreases gradually in accordance with increases and/or decreases in power consumption level. As such, EC 125 may increase the acoustic performance of information handling system 100 and overall user experience accordingly. EC 125 is described in further detail with respect to FIGS. 2-3B.

In one embodiment, memory 130 may comprise a system, device, or apparatus operable to retain and/or retrieve program instructions and/or data for a period of time (e.g., computer-readable media). Memory 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down. In one embodiment, memory 130 may store one or more look up tables (e.g., look up tables 300 and 350 shown in FIGS. 3A and 3B, respectively) and/or firmware instructions operable to allow EC 125 to maintain, or otherwise manage, an operating temperature associated with information handling system 100. Memory 130 is described in further detail with respect to FIGS. 3A and 3B.

Figure 2:
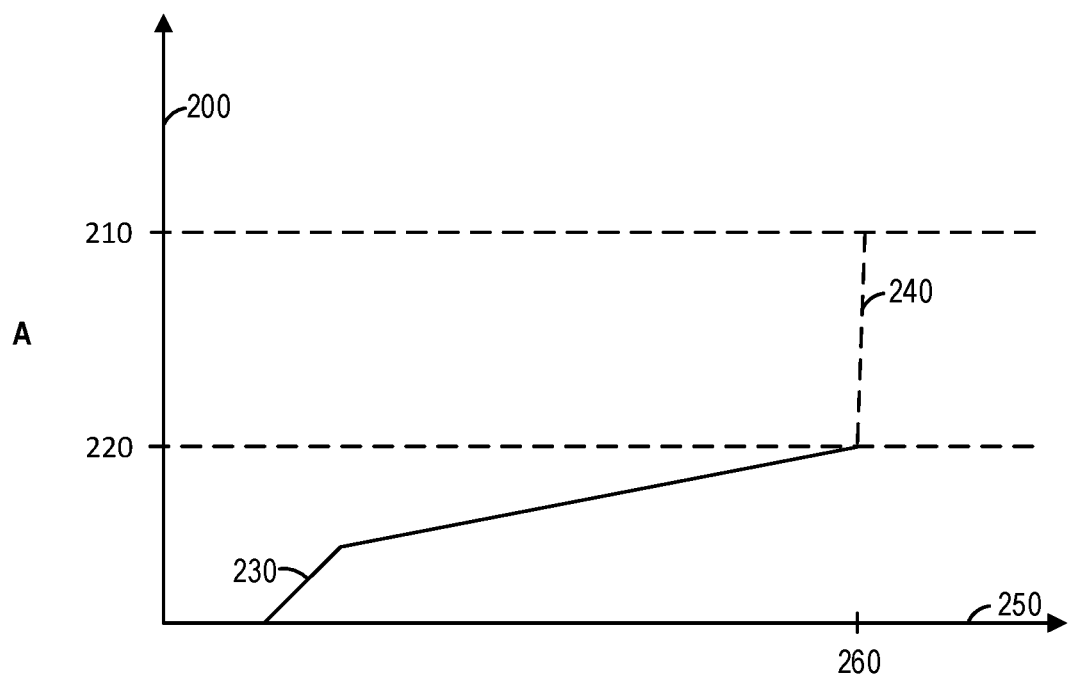
FIG. 2 illustrates selected elements of an embodiment of respective line graphs depicting fans speeds associated with one or more fans of an information handling system.
Figure 2:
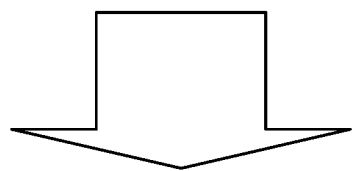
Figure 2:
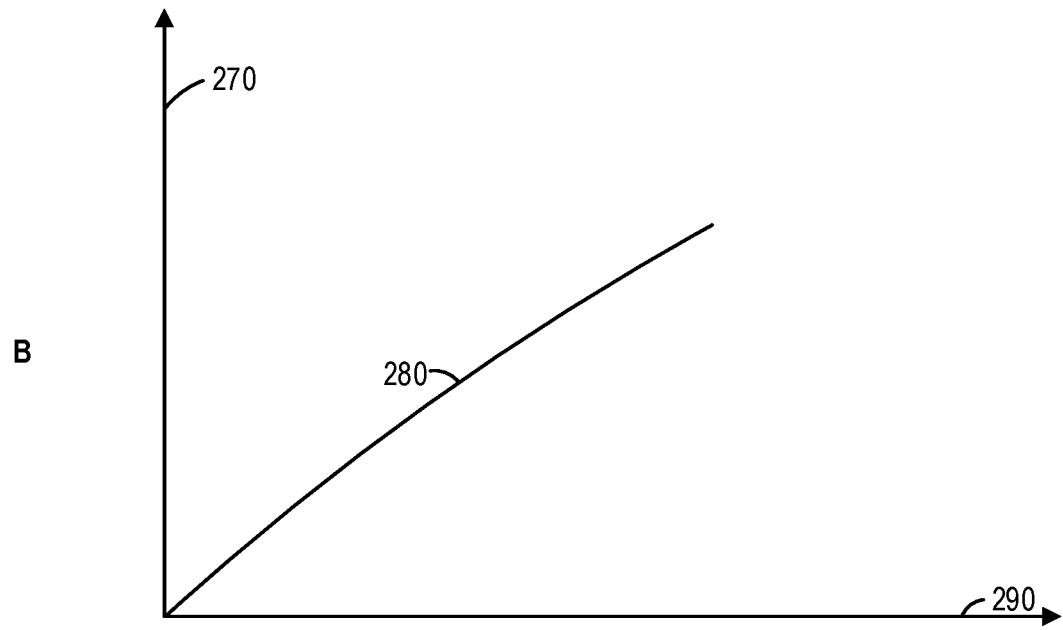

FIG. 2 illustrates selected elements of an embodiment of respective line graphs depicting fans speeds associated with one or more fans of an information handling system. In the embodiment illustrated in FIG. 2, graph A depicts an example correlation, or relationship, between fan speed 200 and operating temperature 250 associated with information handling system 100. Specifically, graph A depicts fan speeds 200 within a threshold operating temperature 260 (e.g., 47° C.) of information handling system 100. Similarly, graph B depicts an example correlation, or relationship, between fan speed 270 and power consumption level 290 associated with information handling system 100. In particular, graph B depicts fan speeds 270 at, and/or exceeding, the threshold operating temperature 260 shown in graph A. In other embodiments, the example correlations, or relationships, depicted in graphs A and B may include additional and/or different correlations, or relationships, than those shown in the embodiment illustrated in FIG. 2.

As shown in graph A, fan speed 200 may increase gradually within threshold operating temperature 260 (e.g., as indicated by gradual increase 230), but may increase rapidly at, and/or beyond, the threshold operating temperature 260 (e.g., as indicated by rapid increase 240). As described above with respect to FIG. 1, such rapid increase in fan speed 200 in response to reaching, and/or exceeding, the threshold operating temperature 260 may further worsen the noise generated by on-board fan assemblies and decrease overall user experience. For example, fan noise associated with fan speed 220 shown in graph A may generate a fan noise of approximately 1.4 sone while fan noise associated with fan speed 210 may generate a fan noise of approximately 3.2 sone. Thus, in this example, an increase in operating temperature 250 of approximately 1° C. (i.e., at, and/or beyond, threshold operating temperature 260 of 47° C.) may cause an increased fan noise of approximately 1.8 sone.

To refrain from causing the rapid increase 240 in fan speed 200 (and associated fan noise) described above, EC 125 may monitor the operating temperature 250 during an operation of information handling system 100 and may compare the operating temperature 250 to the threshold operating temperature 260 (e.g., stored in memory 130) as described above with respect to FIG. 1. If EC 125 determines that the operating temperature 250 is greater than, or equal to, the threshold operating temperature 260, EC 125 may identify that the threshold operating temperature 260 has been reached, and/or exceeded. In response to identifying that the threshold operating temperature 260 has been reached, EC 125 may determine a fan speed 270 to maintain the threshold operating temperature 260 using graph B.

As shown in graph B, fan speed 270 may increase gradually regardless of power consumption level 290 (e.g., as indicated by gradual increase 280). Here, EC 125 may first identify a power consumption level 290 associated with information handling system 100. For example, EC 125 may receive power consumption level data from charger IC 110 as described above with respect to FIG. 1. Once identified, EC 125 may determine fan speed 270 based on power consumption level 290 and may cause one or more fans 115 to rotate based on fan speed 270. By causing the one or more fans 115 to rotate according to fan speed 270 based on power consumption level 290, EC 125 may cause a significant reduction (e.g., 56.3% reduction) in noise as fan speed 270 increases and/or decreases gradually in accordance with increases and/or decreases in power consumption level 290.

Figure 3A:
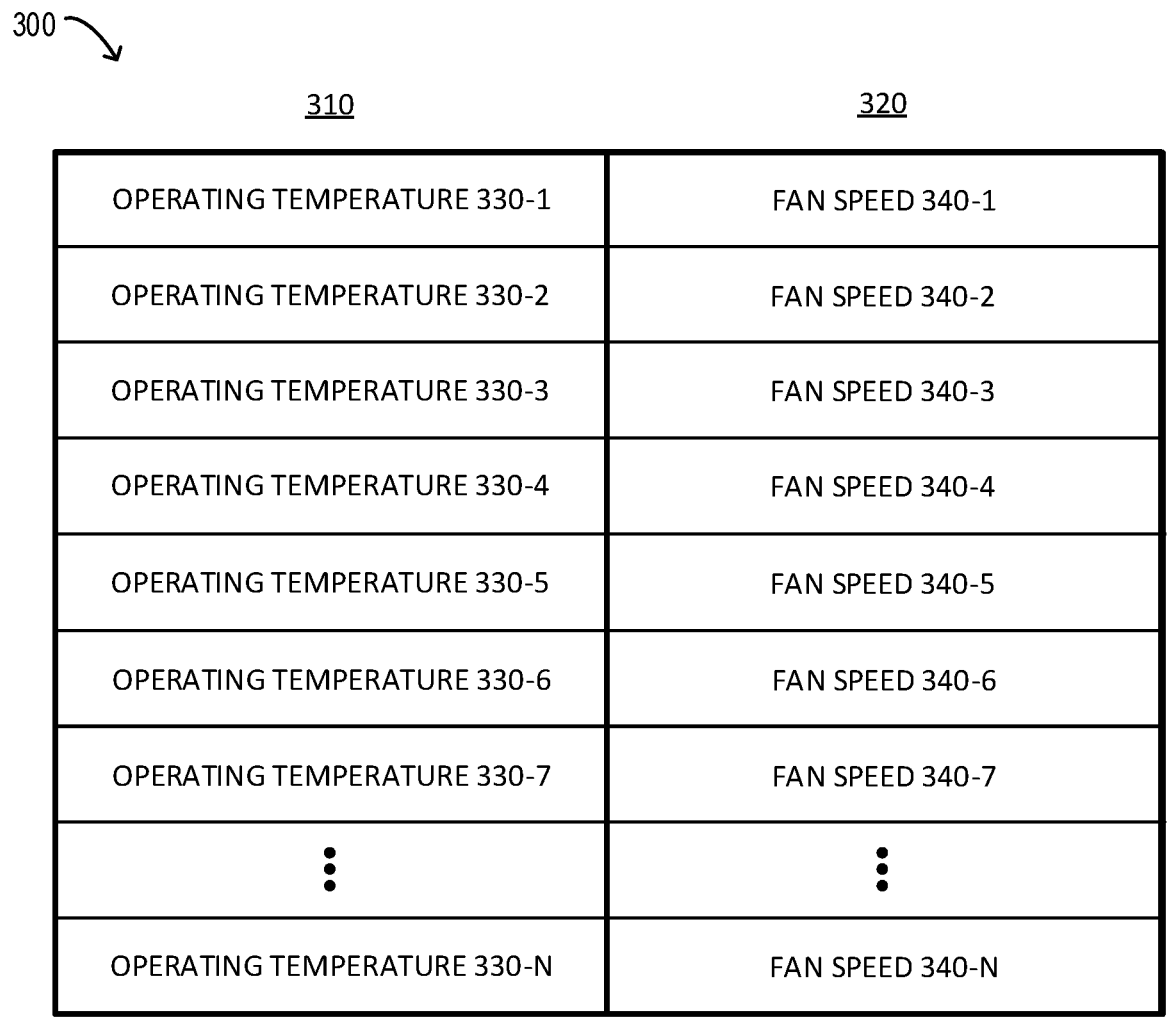

FIGS. 3A and 3B illustrate selected elements of an embodiment of respective look up tables stored in a memory. In one embodiment, look up tables 300 and 350 may be stored in memory 130 of EC 125. In another embodiment, look up tables 300 and 350 may be stored in a memory of information handling system 100 (e.g., memory subsystem 135, local storage resource 145, and the like). In the embodiment illustrated in FIG. 3A, look up table 300 includes operating temperature 310 and fan speed 320 columns. Entries in operating temperature 310 column include operating temperatures 330-1 through 330-N. Entries in fan speed 320 column include fan speeds 340-1 through 340-N. Here, operating temperatures 330-1 through 330-N may correspond to fan speeds 340-1 through 340-N, respectively. In the embodiment illustrated in FIG. 3B, look up table 350 includes power consumption level 360 and fan speed 320 columns. Entries in power consumption level 360 column include power consumption levels 370-1 through 370-N. Entries in fan speed 320 column include fan speeds 380-1 through 380-N. Here, power consumption levels 370-1 through 370-N may correspond to fan speeds 380-1 through 380-N, respectively. In other embodiments, look up tables 300 and 350 may include additional, fewer, and/or different columns (and/or entries within columns) than the columns illustrated in the embodiment shown in FIGS. 3A and 3B.

As described above, each operating temperature associated with information handling system 100 may correspond to a fan speed associated with one or more fans 115 of information handling system 100. That is, each operating temperature may correspond to a fan speed required to maintain an optimal operating temperature, and/or acoustic performance, of information handling system 100. Thus, EC 125 may determine a fan speed associated with one or more fans 115 of information handling system 100 based on an identified operating temperature. In one embodiment, to determine a fan speed based on an identified operating temperature, EC 125 may access look up table 300 (e.g., stored in memory 130) shown in FIG. 3A. As shown in FIG. 3A, look up table 300 may store multiple operating temperatures 330-1 through 330-N. Once EC 125 identifies an operating temperature as described above with respect to FIGS. 1 and 2, EC 125 may identify the operating temperature within the operating temperature 310 column of look up table 300. Because each of the operating temperatures 330-1 through 330-N may correspond to fan speeds 340-1 through 340-N, EC 125 may select a fan speed from fan speed 320 column based on the operating temperature (i.e., a fan speed corresponding to the operating temperature). Once selected, EC 125 may cause the one or more fans 115 to rotate based on the determined fan speed.

Similarly, each power consumption level associated with information handling system 100 may correspond to a fan speed associated with one or more fans 115 of information handling system 100. That is, each power consumption level may correspond to a fan speed required to maintain an optimal operating temperature, and/or acoustic performance, of information handling system 100. Thus, EC 125 may determine a fan speed associated with one or more fans 115 of information handling system 100 based on an identified power consumption level. In one embodiment, to determine a fan speed based on an identified power consumption level, EC 125 may access look up table 350 (e.g., stored in memory 130) shown in FIG. 3B. As shown in FIG. 3B, look up table 350 may store multiple power consumption levels 370-1 through 370-N. Once EC 125 identifies a power consumption level as described above with respect to FIGS. 1 and 2, EC 125 may identify the power consumption level within power consumption level 360 column of look up table 350. Because each of the power consumption levels 370-1 through 370-N may correspond to fans speeds 380-1 through 380-N, EC 125 may select a fan speed from fan speed 320 column based on the power consumption level (i.e., a fan speed corresponding to the power consumption level). Once determined, EC 125 may cause one or more fans 115 to rotate based on the determined fan speed.

In one embodiment, EC 125 may mathematically determine a fan speed based on a power consumption level. In particular, EC 125 may generate a best fit curve (e.g., gradual increase 280 illustrated in FIG. 2) that indicates a relationship between power consumption level and fan speed. For example, an administrator and/or manufacturer of information handling system may generate a best fit curve used to maintain the threshold operating temperature (e.g., 47° C.) when the threshold operating temperature is reached, and/or exceeded, during operation of information handling system 100. In one embodiment, such a best fit curve may be generated in accordance with the following equation:

$$\text{Fan Speed} = \left(\frac{\frac{C_1}{\text{Power}} - C_2}{C_3}\right)^{C_4}.$$

In the equation above, $C_1$, $C_2$, $C_3$, and $C_4$ may be or include curve fit coefficients used, in part, to determine fan speed. In particular, $C_1$ may indicate a power consumption level as it relates to an ambient temperature of information handling system 100. In contrast, $C_2$, $C_3$, and $C_4$ may be unknown values to be determined by the administrator and/or manufacturer of information handling system 100 (e.g., through various factory testing processes). It is noted that although the equation above may be used by EC 125 to mathematically determine fan speed based a power consumption level, respective models of information handling systems having different internal computing architectures may each include, or utilize, different equations.

Figure 4:
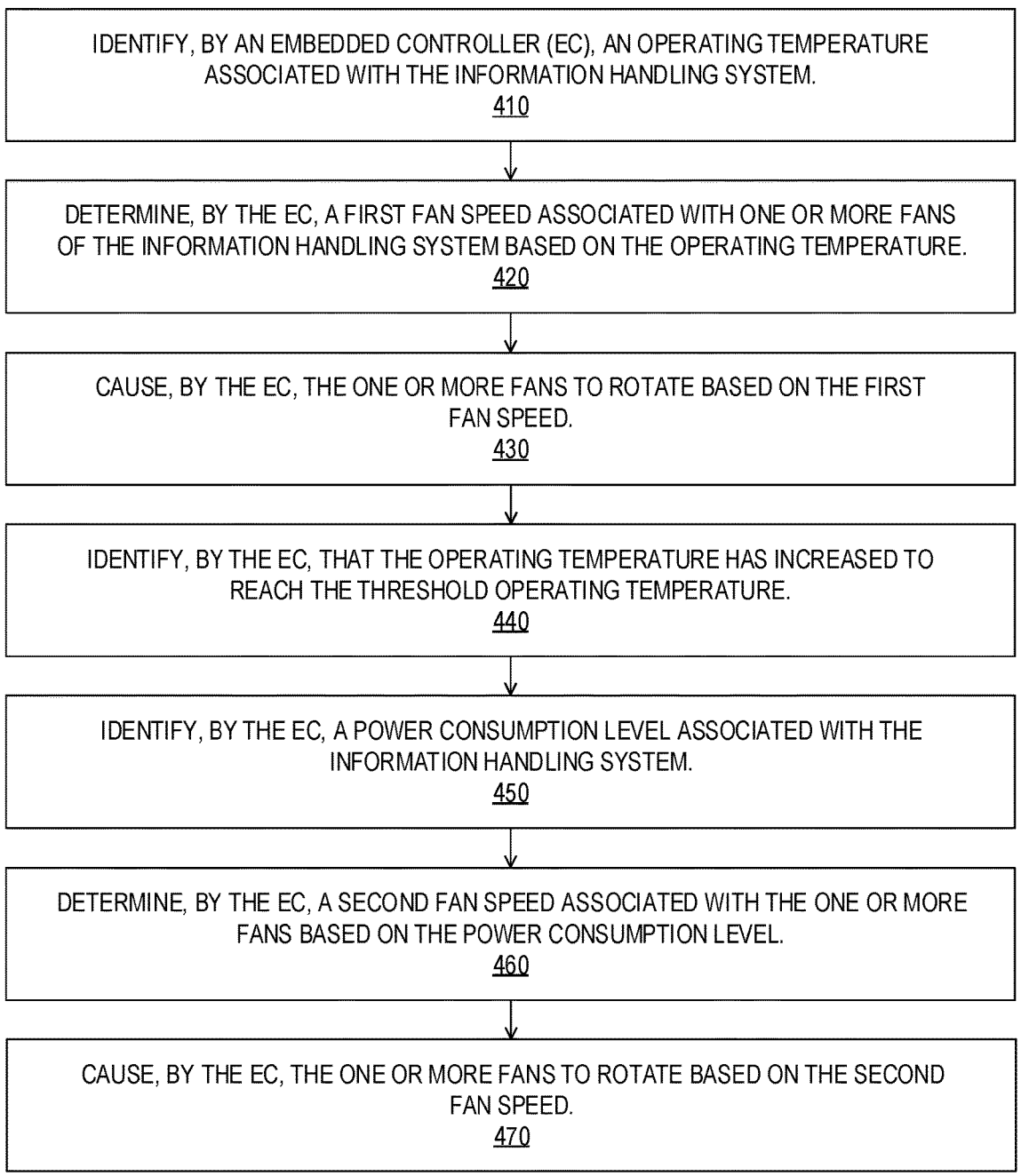
FIG. 4 is a flowchart depicting selected elements of an embodiment of a method for maintaining a threshold operating temperature in an information handling system.

FIG. 4 is a flowchart depicting selected elements of an embodiment of a method for maintaining a threshold operating temperature in an information handling system. It is noted that certain operations described in method 400 may be optional or may be rearranged in different embodiments.

Method 400 may begin at step 410, where an embedded controller (EC) of the information handling system, may identify an operating temperature associated with the information handling system. For example, EC 125 may receive operating temperature data from one or more sensors 105 of information handling system 100 to identify the operating temperature as described above with respect to FIG. 1. At step 420, the EC may determine a first fan speed associated with one or more fans of the information handling system based on the operating temperature. For example, EC 125 may determine a fan speed associated with one or more fans 115 of information handling system 100 based on the identified operating temperature as described above with respect to FIG. 1. At step 430, the EC may cause the one or more fans to rotate based on the first fan speed. For example, EC 125 may cause one or more fans 115 disposed throughout information handling system 100 to rotate according to a fan speed of less than 3,500 RPM based on an operating temperature of less than 47° C. as described above with respect to FIG. 1. At step 440, the EC may identify that the operating temperature has increased to reach the threshold operating temperature. For example, EC 125 may identify that the threshold operating temperature has been reached, and/or exceeded, based on the operating temperature data received from one or more sensors 105 as described above with respect to FIG. 1. At step 450, the EC may identify a power consumption level associated with the information handling system. For example, EC 125 may receive power consumption level data from charger IC 110 of information handling system 100 to identify a power consumption level as described above with respect to FIG. 1. At step 460, the EC may determine a second fan speed associated with the one or more fans based on the power consumption level. For example, EC 125 may determine a fan speed associated with one or more fans 115 of information handling system 100 based on the identified power consumption level as described above with respect to FIG. 1. At step 470, the EC may cause the one or more fans to rotate based on the second fan speed. For example, EC 125 may cause one or fans 115 disposed throughout information handling system 100 to rotate according to a fan speed greater than 3,500 RPM based on a power consumption level greater than 10 W.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method for maintaining a threshold operating temperature in an information handling system, the method comprising:

identifying, by an embedded controller (EC) of the information handling system, an operating temperature associated with the information handling system;

determining, by the EC, a first fan speed associated with one or more fans of the information handling system based on the operating temperature;

causing, by the EC, the one or more fans to rotate based on the first fan speed;

identifying, by the EC, that the operating temperature has increased to reach the threshold operating temperature; and in response to identifying that the operating temperature has increased to reach the threshold operating temperature:

determining, by the EC, a relationship model between power consumption level of the information handling system and fan speed of the one or more fans to maintain the information handling system operating at the threshold operating temperature;

identifying, by the EC, a current power consumption level associated with the information handling system;

determining, by the EC and as indicated by the relationship model, a second fan speed associated with the one or more fans corresponding to the current power consumption level; and causing, by the EC, the one or more fans to rotate based on the second fan speed to maintain the information handling system operating at the threshold operating temperature.

2. The method of claim 1, wherein determining the first fan speed associated with the one or more fans based on the operating temperature comprises:
- accessing, by the EC, a memory of the EC, the memory including a first look up table storing a plurality of operating temperatures associated with the information handling system, the plurality of operating temperatures corresponding to a first plurality of fan speeds associated with the one or more fans;
- identifying, by the EC, the operating temperature from the plurality of operating temperatures; and
- selecting, by the EC, the first fan speed from the first plurality of fan speeds based on the operating temperature.

3. The method of claim 1, wherein identifying that the operating temperature has increased to reach the threshold operating temperature comprises:
- monitoring, by the EC, the operating temperature during an operation of the information handling system;
- comparing, by the EC, the operating temperature to the threshold operating temperature; and
- determining, by the EC, that the operating temperature is equal to the threshold operating temperature.

4. The method of claim 1, wherein identifying the operating temperature associated with the information handling system comprises:
- receiving, by the EC, operating temperature data from one or more sensors of the information handling system.

5. The method of claim 1, wherein identifying the current power consumption level associated with the information handling system comprises:
- receiving, by the EC, power consumption level data from a charger integrated circuit (IC) of the information handling system.

6. The method of claim 1, wherein the relationship model is a best fit curve indicating a relationship between the power consumption level of the information handling system and the fan speed of the one or more fans.

7. One or more computer-readable non-transitory storage media embodying software that is operable when executed by one or more processors to cause the system to:
- identify, by an embedded controller (EC) of the information handling system, an operating temperature associated with the information handling system;
- determine, by the EC, a first fan speed associated with one or more fans of the information handling system based on the operating temperature;
- cause, by the EC, the one or more fans to rotate based on the first fan speed;
- identify, by the EC, that the operating temperature has increased to reach a threshold operating temperature; and
- in response to identifying that the operating temperature has increased to reach the threshold operating temperature:
  - determine, by the EC, a relationship model between power consumption level of the information handling system and fan speed of the one or more fans to maintain the information handling system operating at the threshold operating temperature
  - identify, by the EC, a current power consumption level associated with the information handling system;
  - determine, by the EC and as indicated by the relationship model, a second fan speed associated with the one or more fans corresponding to the current power consumption level; and
  - cause, by the EC, the one or more fans to rotate based on the second fan speed to maintain the information handling system operating at the threshold operating temperature.

8. The media of claim 7, wherein to determine the first fan speed associated with the one or more fans based on the operating temperature, the software is further operable when executed to:
- access, by the EC, a memory of the EC, the memory including a first look up table storing a plurality of operating temperatures associated with the information handling system, the plurality of operating temperatures corresponding to a first plurality of fan speeds associated with the one or more fans;
- identify, by the EC, the operating temperature from the plurality of operating temperatures; and
- select, by the EC, the first fan speed from the first plurality of fan speeds based on the operating temperature.

9. The media of claim 7, wherein to identify that the operating temperature has increased to reach the threshold operating temperature, the software is further operable when executed to:
- monitor, by the EC, the operating temperature during an operation of the information handling system;
- compare, by the EC, the operating temperature to the threshold operating temperature; and
- determine, by the EC, that the operating temperature is equal to the threshold operating temperature.

10. The media of claim 7, wherein to identify the operating temperature associated with the information handling system, the software is further operable when executed to:
- receive, by the EC, operating temperature data from one or more sensors of the information handling system.

11. The media of claim 7, wherein to identify the current power consumption level associated with the information handling system, the software is further operable when executed to:
- receive, by the EC, power consumption level data from a charger integrated circuit (IC) of the information handling system.

12. The media of claim 7, wherein the relationship model is a best fit curve indicating a relationship between the power consumption level of the information handling system and the fan speed of the one or more fans.

13. A computing environment, comprising:
- an information handling system including one or more processors; and
- one or more computer-readable non-transitory storage media coupled to one or more of the processors and comprising instructions operable when executed by one or more of the processors to cause the system to:
  - identify, by an embedded controller (EC) of the information handling system, an operating temperature associated with the information handling system;
  - determine, by the EC, a first fan speed associated with one or more fans of the information handling system based on the operating temperature;
  - cause, by the EC, the one or more fans to rotate based on the first fan speed;
  - identify, by the EC, that the operating temperature has increased to reach a threshold operating temperature; and
  - in response to identifying that the operating temperature has increased to reach the threshold operating temperature:
    - determine, by the EC, a relationship model between power consumption level of the information handling system and fan speed of the one or more fans to maintain the information handling system operating at the threshold operating temperature identify, by the EC, a current power consumption level associated with the information handling system;

determine, by the EC and as indicated by the relationship model, a second fan speed associated with the one or more fans corresponding to the current power consumption level; and cause, by the EC, the one or more fans to rotate based on the second fan speed to maintain the information handling system operating at the threshold operating temperature.

14. The computing environment of claim 13, wherein to determine the first fan speed associated with the one or more fans based on the operating temperature, the processors are further operable when executed to:

access, by the EC, a memory of the EC, the memory including a first look up table storing a plurality of operating temperatures associated with the information handling system, the plurality of operating temperatures corresponding to a first plurality of fan speeds associated with the one or more fans;

identify, by the EC, the operating temperature from the plurality of operating temperatures; and select, by the EC, the first fan speed from the first plurality of fan speeds based on the operating temperature.

15. The computing environment of claim 13, wherein to identify that the operating temperature has increased to reach the threshold operating temperature, the processors are further operable when executed to:

monitor, by the EC, the operating temperature during an operation of the information handling system;

compare, by the EC, the operating temperature to the threshold operating temperature; and determine, by the EC, that the operating temperature is equal to the threshold operating temperature.

16. The computing environment of claim 13, wherein to identify the operating temperature associated with the information handling system, the processors are further operable when executed to:

receive, by the EC, operating temperature data from one or more sensors of the information handling system.

17. The computing environment of claim 13, wherein to identify the current power consumption level associated with the information handling system, the processors are further operable when executed to:

receive, by the EC, power consumption level data from a charger integrated circuit (IC) of the information handling system.

* * * * *